United States Patent
Sears et al.

(10) Patent No.: US 11,087,950 B2
(45) Date of Patent: Aug. 10, 2021

(54) CHARGE CONTROL DEVICE FOR A SYSTEM WITH MULTIPLE ELECTRON BEAMS

(71) Applicant: KLA-TENCOR CORPORATION, Milpitas, CA (US)

(72) Inventors: Christopher Sears, Fremont, CA (US); Luca Grella, Gilroy, CA (US)

(73) Assignee: KLA-Tencor Corporation, Milpitas, CA (US)

(*) Notice: Subject to any disclaimer, the term of this patent is extended or adjusted under 35 U.S.C. 154(b) by 172 days.

(21) Appl. No.: 16/112,832

(22) Filed: Aug. 27, 2018

(65) Prior Publication Data
US 2019/0371566 A1    Dec. 5, 2019

Related U.S. Application Data

(60) Provisional application No. 62/677,551, filed on May 29, 2018.

(51) Int. Cl.
| | | |
|---|---|---|
| *H01J 37/10* | (2006.01) | |
| *H01J 37/153* | (2006.01) | |
| *H01J 37/06* | (2006.01) | |
| *H01J 37/22* | (2006.01) | |
| H01J 37/28 | (2006.01) | |

(52) U.S. Cl.
CPC ............ *H01J 37/153* (2013.01); *H01J 37/06* (2013.01); *H01J 37/10* (2013.01); *H01J 37/222* (2013.01); *H01J 37/224* (2013.01); H01J 37/28 (2013.01); H01J 2237/153 (2013.01)

(58) Field of Classification Search
CPC .......... H01J 37/05; H01J 37/153; H01J 37/06; H01J 37/224; H01J 37/10; H01J 37/222
See application file for complete search history.

(56) References Cited

U.S. PATENT DOCUMENTS

| | | | | |
|---|---|---|---|---|
| 6,125,522 A | * | 10/2000 | Nakasuji | H01J 9/236 29/458 |
| 6,552,340 B1 | * | 4/2003 | Krivanek | H01J 37/153 250/305 |
| 7,146,084 B2 | * | 12/2006 | Atac | G02B 27/0172 385/115 |
| 9,620,329 B1 | * | 4/2017 | Cook | H01J 37/153 |

(Continued)

FOREIGN PATENT DOCUMENTS

| | | |
|---|---|---|
| KR | 101052335 A | 7/2011 |
| KR | 101405901 B1 | 6/2014 |

OTHER PUBLICATIONS

WIPO, ISR for PCT/US2019/034082, Sep. 20, 2019.

*Primary Examiner* — David P Porta
*Assistant Examiner* — Djura Malevic
(74) *Attorney, Agent, or Firm* — Hodgson Russ LLP

(57) ABSTRACT

Systems and methods to focus and align multiple electron beams are disclosed. A camera produces image data of light from electron beams that is projected at a fiber optics array with multiple targets. An image processing module determines an adjustment to a voltage applied to a relay lens, a field lens, or a multi-pole array based on the image data. The adjustment minimizes at least one of a displacement, a defocus, or an aberration of one of the electron beams. Using a control module, the voltage is applied to the relay lens, the field lens, or the multi-pole array.

20 Claims, 8 Drawing Sheets

(56) References Cited

U.S. PATENT DOCUMENTS

| | | | |
|---|---|---|---|
| 2003/0007087 A1* | 1/2003 | Hakamata | A61B 1/0653 |
| | | | 348/370 |
| 2003/0168606 A1* | 9/2003 | Adamec | H01J 37/04 |
| | | | 250/396 R |
| 2004/0159787 A1 | 8/2004 | Nakasuji et al. | |
| 2004/0252940 A1* | 12/2004 | Atac | G02B 27/0172 |
| | | | 385/31 |
| 2007/0228274 A1* | 10/2007 | Elyasaf | G01N 23/2251 |
| | | | 250/306 |
| 2010/0213370 A1* | 8/2010 | Nakasuji | G01N 23/225 |
| | | | 250/310 |
| 2012/0205537 A1* | 8/2012 | Jiang | H01J 37/147 |
| | | | 250/307 |
| 2015/0083911 A1 | 3/2015 | Zeidler et al. | |
| 2016/0268096 A1* | 9/2016 | Ren | H01J 37/1472 |
| 2016/0329189 A1* | 11/2016 | Sears | H01J 37/28 |
| 2017/0148609 A1* | 5/2017 | Cook | H01J 37/147 |
| 2018/0040452 A1 | 2/2018 | Hatakeyama et al. | |

* cited by examiner

CHARGE CONTROL DEVICE FOR A SYSTEM WITH MULTIPLE ELECTRON BEAMS

CROSS-REFERENCE TO RELATED APPLICATIONS

This application claims priority to the provisional patent application filed May 29, 2018 and assigned U.S. App. No. 62/677,551, the disclosure of which is hereby incorporated by reference.

FIELD OF THE DISCLOSURE

This disclosure relates to control of electron beams.

BACKGROUND OF THE DISCLOSURE

Evolution of the semiconductor manufacturing industry is placing ever greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

One inspection technology includes electron beam based inspection such as scanning electron microscopy. In some instances, scanning electron microscopy is performed via a scanning electron microscope (SEM) system which includes an increased number of electron-optical columns (e.g., a multi-column SEM system). In other instances, scanning electron microscopy is performed via secondary electron beam collection (e.g., a secondary electron (SE) imaging system). In other instances, scanning electron microscopy is performed by splitting a single electron beam into numerous beams and utilizing a single electron-optical column to individually tune and scan the numerous beams (e.g., a multi-beam SEM system).

Splitting the single electron beam into numerous beams or generating an array of electron beams for a multi-beam SEM system is complicated. Aligning multiple electron beams is particularly challenging. Improved systems and methods to focus and align multiple electron beams are needed.

BRIEF SUMMARY OF THE DISCLOSURE

A system is provided in a first embodiment. The system comprises an electron source, a relay lens, a field lens, a multi-pole array, a projection lens, a scintillator, a fiber optics array, a camera, and a processor. The electron source generates electrons that form a plurality of electron beams. The electron source directs the electron beams to the relay lens. The field lens is disposed downstream of the relay lens along the path of the electron beams. The multi-pole array is disposed downstream of the field lens along the path of the electron beams. The projection lens is disposed downstream of the multi-pole array along the path of the electron beams. The scintillator is disposed downstream of the projection lens along a path of the electron beams. The fiber optics array has a plurality of targets. The fiber optics array is disposed to receive light from each of the electrons beams using one of the targets. The camera is configured to image light passing from the scintillator to the fiber optics array. The camera is configured to produce image data. The processor is in electronic communication with the camera, the relay lens, the field lens, and the multi-pole array. The processor is configured to determine an adjustment to a voltage applied to the relay lens, the field lens, or the multi-pole array based on image data from the camera and to apply the adjustment to the relay lens, the field lens, or the multi-pole array.

The system can further include a beam splitter disposed between the scintillator and the fiber optics array.

The camera may be a CMOS camera.

The fiber optics array can be hexagonal.

The multi-pole array may be an octupole.

In an instance, the processor is further configured to measure a displacement of each of the electron beams with respect to a corresponding one of the targets and determine the adjustment to minimize the displacement.

In an instance, the processor is further configured to measure a defocus of each of the electron beams with respect to a corresponding one of the targets and determine the adjustment to minimize the defocus.

In an instance, the processor is further configured to measure an aberration of each of the electron beams with respect to a corresponding one of the targets and determine the adjustment to minimize the aberration.

In an instance, the processor is further configured to solve the sensitivity matrix $A_{ij} V_j = -X_i$, wherein $V_j$ are voltages of the octupole and wherein $X_i$ are measured displacements of the electron beams. An inverse of the sensitivity matrix $A_{ij}$ can be applied to the multi-pole array. Each element of the sensitivity matrix may be defined as a ratio between $dX_i$ displacement and $dV_j$.

A method is provided in a second embodiment. Image data of a plurality of electron beams is produced using a camera as light from the electron beams is projected at a fiber optics array having a plurality of targets. Using an image processing module, an adjustment to a voltage applied to a relay lens, a field lens, or a multi-pole array is determined based on the image data. The adjustment minimizes at least one of a displacement, a defocus, or an aberration of one of the electron beams. Using a control module, the voltage is applied to the relay lens, the field lens, or the multi-pole array to perform the adjustment.

The method can further comprise generating the electron beams using an electron source projecting the electron beams through the relay lens, the field lens, the multi-pole array, a projection lens, and into a scintillator.

In an instance, the determining can include measuring, using the image processing module, a displacement of each of the electron beams with respect to a corresponding one of the targets and determining the adjustment to minimize the displacement using the image processing module.

In an instance, the determining can include measuring, using the image processing module, a defocus of each of the electron beams with respect to a corresponding one of the targets and determining the adjustment to minimize the defocus using the image processing module.

In an instance, the determining can include measuring, using the image processing module, an aberration of each of the electron beams with respect to a corresponding one of the targets and determining the adjustment to minimize the aberration using the image processing module.

In an instance, the determining can include solving a sensitivity matrix $A_{ij} V_j = -X_i$ using the image processing module, wherein $V_j$ are voltages of the multi-pole array and wherein $X_i$ are measured displacements of the electron beams. Using the control module, an inverse of the sensitivity matrix $A_{ij}$ can be applied to the multi-pole array. Each element of the sensitivity matrix is defined as a ratio between $dX_i$ displacement and $dV_j$.

The multi-pole array may be an octupole.

The method can further include activating a combination of different excitations of the poles in the multi-pole array, measuring a displacement of the electron beams for each of the different excitations, and calibrating the multi-pole array based on a matrix of the displacement of the electron beams for each of the different excitations.

A non-transitory computer-readable storage medium is provided in a third embodiment. The non-transitory computer-readable storage medium includes one or more programs for executing the following steps on one or more computing devices. Image data of a plurality of electron beams is received at an image processing module from a camera as light from the electron beams is projected at a fiber optics array having a plurality of targets. Using the image processing module, an adjustment to a voltage applied to a relay lens, a field lens, or a multi-pole array is determined based on the image data. The adjustment minimizes at least one of a displacement, a defocus, or an aberration of one of the electron beams. Using a control module, the voltage is applied to the relay lens, the field lens, or the multi-pole array to perform the adjustment.

The determining can includes solving a sensitivity matrix $A_{ij} V_j = -X_i$ using the image processing module, wherein $V_j$ are voltages of the multi-pole array and wherein $X_i$ are measured displacements of the electron beams. Using the control module, an inverse of the sensitivity matrix $A_{ij}$ can be applied to the multi-pole array. Each element of the sensitivity matrix is defined as a ratio between $dX_i$ displacement and $dV_j$.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

A scanning electron multibeam microscope (SEMM) can form an array of beams by imaging an electron point source on a wafer through an array of micro apertures. The array of positions, from which the secondary electrons are emitted at the wafer, is de-scanned and imaged on a scintillator. The optical image can be relayed and aligned to a fiber optics array so that the intensity of each fiber element represents the pixel intensity of each secondary beam at any given time. The intensity can then be used to form each image created by each scanning beam. To avoid cross-talk and image overlap, the images of the return secondary beams at the detector may be kept separate and each secondary beam may be kept focused and aligned with the fiber optics array. When imaging wafers with an insulating surface, the array of beams scanning the wafer surface can lead to severe charging which distorts the image of the array of the secondary electron beams and introduces higher order aberrations and image rotation, which affects beam cross talk, focus, and placement. The embodiments disclosed herein describe a charge control system with a feedback loop that can maintain the secondary electron beam images such that these are focused and aligned with the fiber optics by monitoring the array of secondary beams at the image plane. The charge control system can compensate not only for deflections but also for charging induced distortions, higher order aberrations, and image rotation.

Figure 1:
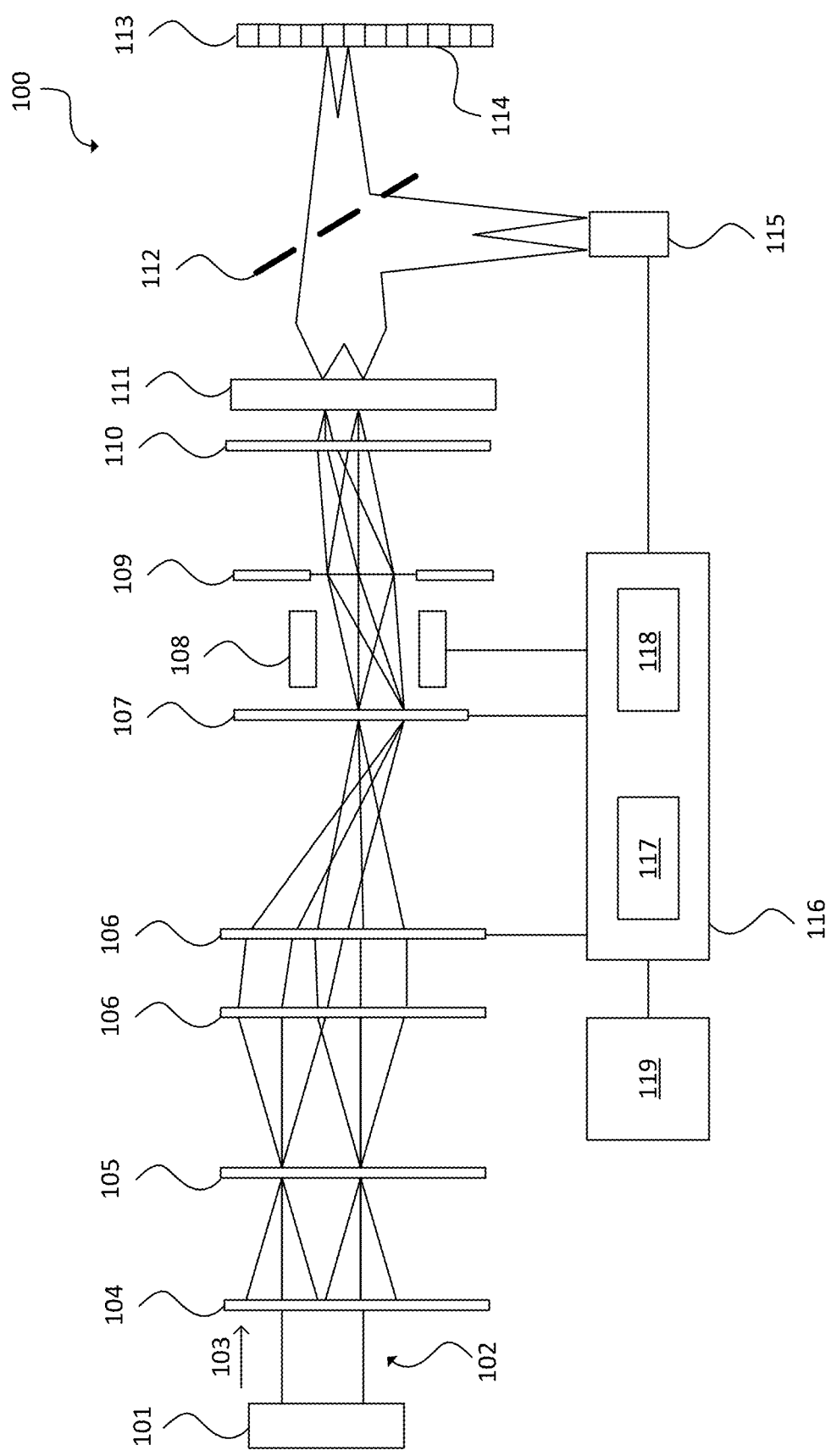
FIG. 1 is a block diagram of an embodiment of a system in accordance with the present disclosure.

FIG. 1 is a block diagram of an embodiment of a system 100. The system 100 includes an electron source 101 that generates electrons that form a plurality of electron beams 102. Two electron beams 102 are illustrated as projected along a path 103. More electron beams 102 are possible.

The electron beams 102 can be split from a single electron beam generated by the electron source 101. The electron beams 102 also can be generated from an array in the electron source 101 that is configured to provide multiple electron beams 102. The electron source 101 can include photocathodes, Schottky emitters, or other types of electron beam generation devices.

The system 100 also includes an objective lens 104, an image plane 105, a relay lens 106, a field lens 107, a multi-pole array (e.g., an octupole 108), an aperture plane 109, a projection lens 110, and a scintillator 111. The electron source 101 directs the electron beams 102 to the relay lens 106 via the objective lens 104 and image plane 105. The field lens 107 is disposed downstream of the relay lens 106 along a path 103 of the electron beams 102. The multi-pole array is disposed downstream of the field lens 107 along a path 103 of the electron beams 102. The projection lens 110 is disposed downstream of the octupole 108 along a path 103 of the electron beams 102. The scintillator 111 is disposed downstream of the projection lens 110 along a path 103 of the electron beams 102. The project lens 110 can magnify the image of the electron beams 102 and forms an image plane on the scintillator 111. The aperture plane 109 can include an aperture plate that has an aperture that the electron beam 102 passes through.

While an octupole 108 is disclosed as the multi-pole array, a quadrupole or a multi-pole array with at least six poles may be used instead. The multi-pole array may be an array of magnets or electrodes.

The scintillator 111 can include a luminescent material. For example, yttrium aluminum garnet (YAG), sodium iodide (NaI), or bismuth germanium oxide (BGO) may be used as a luminescent material. The electron beam 102 received by the scintillator 111 may be converted to light or can be used to generate light.

Figure 2:
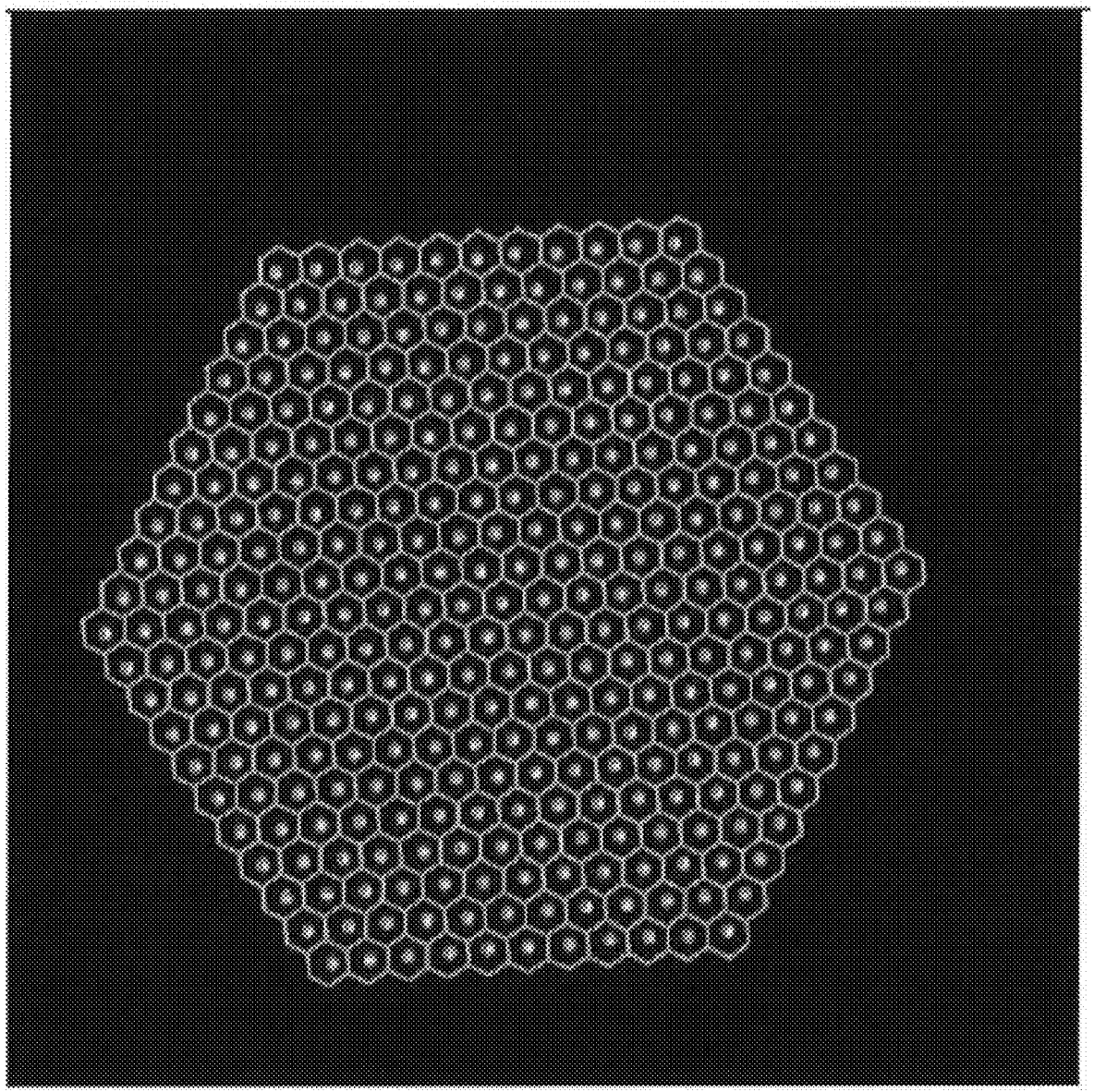
FIG. 2 is an image of the secondary beam array relayed on the fiber optics array in an absence of charging.
Figure 3:
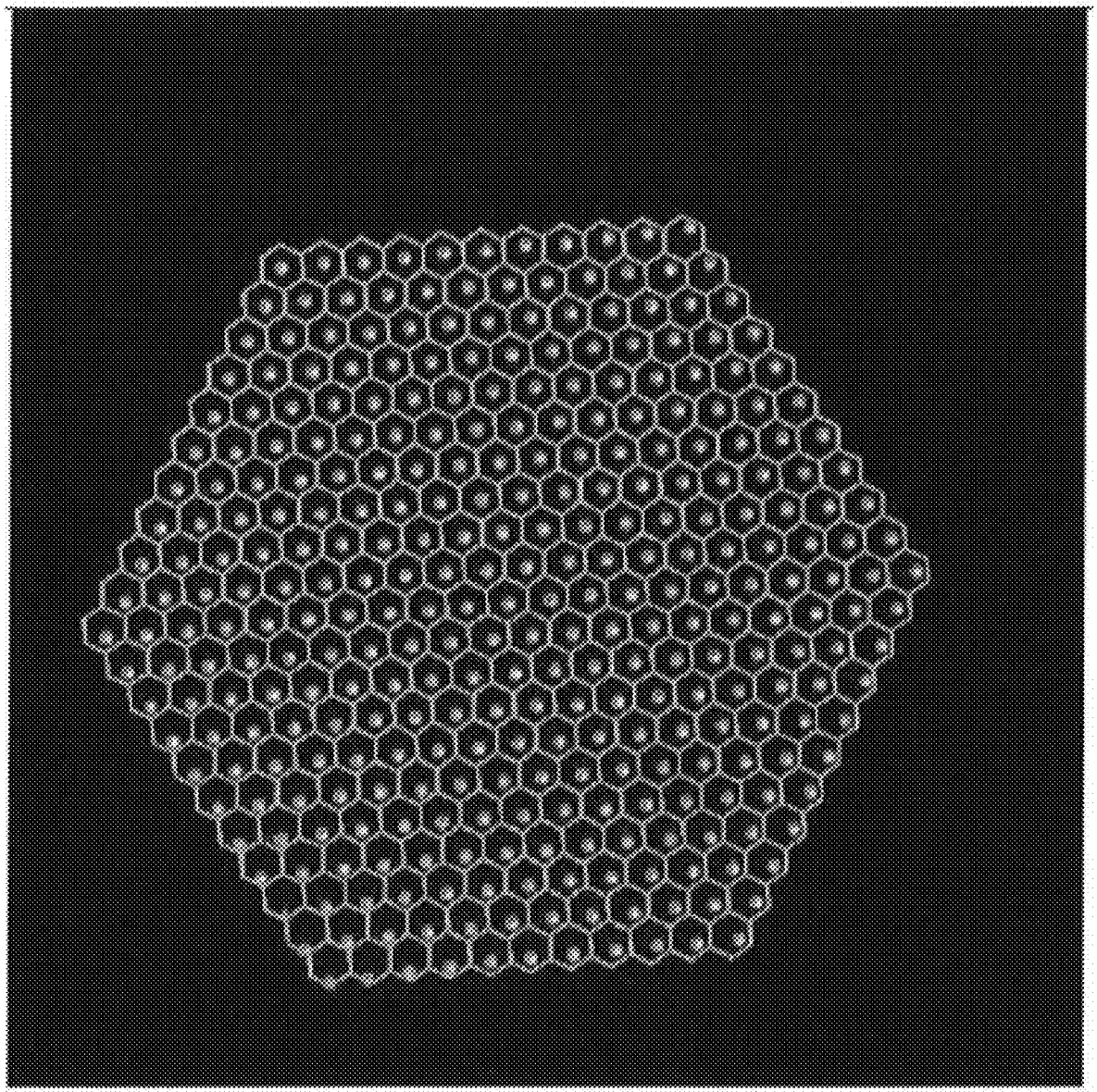
FIG. 3 is an image of the second beam array relayed on the fiber optics array with charging of 20 V.
Figure 4:
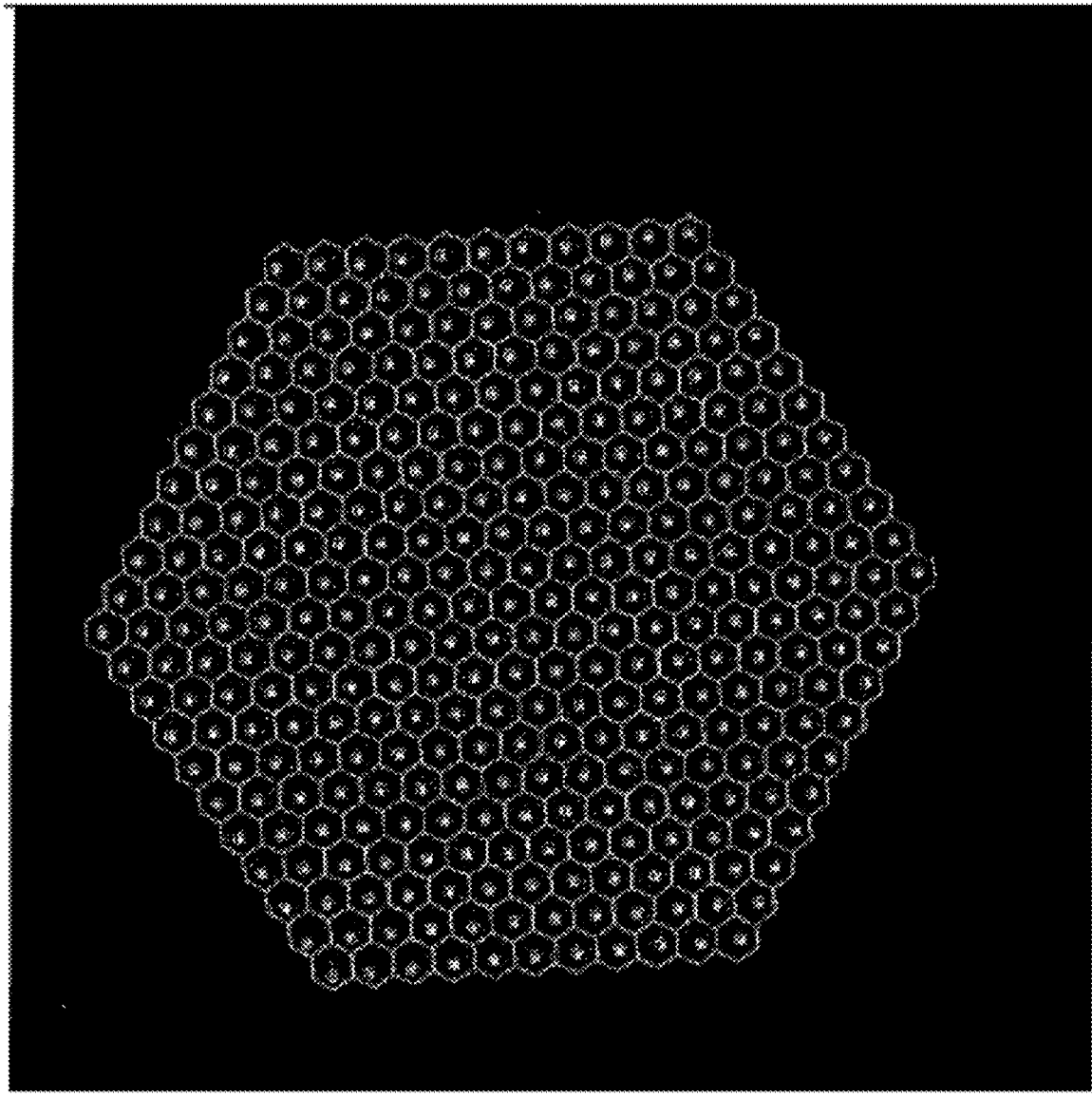
FIG. 4 is an image of beam placement after octupole correction with charging of 20 V.

A fiber optics array 113 has multiple targets 114. The fiber optics array 113 is disposed relative to the scintillator 111 such that the fiber optics array 113 receives light from each of the electron beams 102 using one of the targets 114. Each of the targets 114 can have one optical fiber. Thus, there may be the same number of targets 114 as electron beams 102 or more targets 114 than electron beams 102. The fiber optics array 113 may be a bundle of fiber optic devices, each of which can be one of the targets 114. For example, the fiber optics array 113 can be a bundle of fibers arranged in a hexagonal pattern as illustrated in FIGS. 2-4.

In an instance, there are 331 electron beams 102 and 331 targets 114. Larger numbers of electron beams 102 and targets 114 are possible.

The fiber optics array 113 may be hexagonal or other shapes. A hexagonal shape may be used to maximize the number of fibers per unit area.

A camera 115 is configured to image light from the electron beams 102 passing from the scintillator 111 to the fiber optics array 113. The camera 115 produces image data. The camera 115 may have a frame rate compatible with the feedback bandwidth. For 100 Hz, the camera 115 may operate with at least 100 frame per second. In an instance, the camera 115 is a CMOS camera.

A beam splitter 112 may be disposed between the scintillator 111 and the fiber optics array 113 in the path of light produced by the scintillator 111. This can produce beams that are received by the camera 115.

Image acquisition can be performed by a fast interface (e.g., camera link). The interface may have a frame rate that allows tracking of the charging effects at a frequency of at least 100 Hz.

A processor 116 is in electronic communication with the camera 115, the relay lens 106, the field lens 107, and the octupole 108. The processor 116 also may be in electronic communication with the fiber optics array 113 or the targets 114. The processor 116 is configured to determine an adjustment to a voltage applied to the relay lens 106, the field lens 107, and or octupole 108 based on image data from the camera 115. The processor 116 also can be in electronic communication with an electronic data storage medium 119. The electronic data storage medium 119 can include instructions to be executed by the processor 116.

The processor 116 can measure a displacement, defocus, and/or aberration of each of the electron beams 102 with respect to a corresponding one of the targets 114. The corresponding target 114 may be the one that receives light from the scintillator 111 for the electron beam 102. In an instance, displacement is when the electron beam is incorrectly projected in the x or y direction, defocus is when the electron beam is out of focus due to position of the focal point, and an aberration is when the electron beam is blurred or distorted because the light is spread out. For example, this measurement can use an image processing module 117. The processor 116 can determine the adjustment to minimize the displacement, defocus, and/or aberration with the control module 118.

In an instance, the processor 116 solves a sensitivity matrix $A_{ij} V_j = -X_i$. $V_j$ are voltages of the multi-pole array (e.g., octupole 108) and $X_i$ are measured displacements of the electron beams. An inverse of the sensitivity matrix $A_{ij}$ is applied to the multi-pole array (e.g., octupole 108). Each matrix element of the sensitivity matrix is defined as a ratio between $dX_i$ displacement and $dV_j$. The matrix element can represent the deflection of a single beam when one excitation is turned on.

All the calculations, beam tracking, and linear regression, can be performed within the desired frame rate using a field-programmable gate array (FPGA) or a CPU/GPU based system.

In an example, the imaging arm of the SEMM in FIG. 1 forms a de-scanned image of the secondary beams at the scintillator 111. The feedback loop can monitor the image plane through the beam splitter 112, the camera 115, and the image processing module 117. Through the control module 118, the processor 116 can apply corrections to the relay lens 106, the field lens 107, and the octupole 108 using the control module 118. The feedback loop can maintain the electron beams 102 to be focused and aligned with the fiber optics in the fiber optics array 113.

Real time image processing can compute the corrections by measuring the displacement of each electron beam 102, its defocus and aberrations directly on the scintillator image. Deflections and defocus are then converted into signals using a suitable algorithm. To match the secondary beam array to the fiber optics array 113, the fiber optics array 113 may be a hexagonal close-packed type. FIG. 2 shows the placement of the image of the secondary beams on the fiber optics array side. The light from the electron beams is shown in the center of each target. Using a computer simulation that performs ray tracing and calculates specimen charging, the image of the secondary beams in the presence of charging can be simulated. FIG. 3 shows how the placement of the beams centroids is distorted and aberrated at the image plane when the SEMM is scanning along an area that is charging up to +20 Volts. Several degrees of freedom may be needed to correct the complex distortion pattern formed at the image plane. These several degrees of freedom can be implemented using the octupole 108 or other multi-pole array. For example, the octupole 108 may be placed before the image plane at the scintillator and its excitations (8 voltages, $V_i$) can be calculated by applying to the measured distortions the inverse of the sensitivity matrix $A_{ij}$. Each element of the matrix can be defined as the ratio between the $dX_i$ displacement (with $1 < i < N_b$, where $N_b$ is the number of beams) and the $dV_j$ (with $1 < j < 8$) which are the characteristic excitations that can either be single pole excitations (one pole active and the other seven grounded) or any linear combination of excitations. For instance, there may be four possible quadrupole fields.

The linear system $A_{ij} V_j = -X_i$ can be solved. In this example, $A_{ij}$ is the sensitivity matrix already discussed, $V_j$ are the eight voltages of the octupole 108, and $X_i$ are the measured displacements. The x component of the displacement is assigned to even rows and the y component is assigned to the odd rows. This forms an over-constrained linear system with 2Nb rows (Nb is the number of beams) and a number of columns equal to the characteristic excitations. In this example, eight single pole excitations plus four quadrupole fields are used to correct for higher order aberrations, plus focus and rotation. The over-constrained system can be solved using a linear regression approach or other techniques. The system, since it employs quadrupole fields, can also correct for higher order aberrations. By applying this technique to the displacements, octupole voltages that correct the beams centering errors shown in FIG. 3 can be derived. FIG. 4 shows the beam array placement after correction applied by the octupole with voltages as derived from linear regression.

The exemplary images of FIGS. 2-4 can be generated without the honeycomb shape surrounding the targets 114. The dot position of the electron beams 102 can be monitored in real-time.

Turning back to FIG. 1, the processor 116 and electronic data storage medium 119, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

The processor 116 and electronic data storage unit 119 may be disposed in or otherwise part of the system 100 or another device. In an example, the processor 116 and electronic data storage unit 119 may be part of a standalone control unit or in a centralized quality control unit. Multiple processors 116 or electronic data storage unit 119 may be used.

The processor 116 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 116 to implement various methods and functions may be stored in readable storage media, such as a memory in the electronic data storage unit 119 or other memory.

The processor 116 may be configured to perform a number of functions using the output of the system 100 or other output. For instance, the processor 116 may be configured to send the output to an electronic data storage unit 119 or another storage medium. The processor 116 may be further configured as described herein.

Multiple subsystems with a processor 116 can be used. These different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 116 may be configured according to any of the embodiments described herein. The processor 116 also may be configured to perform other functions or additional steps using the output of the system 100 or using images or data from other sources.

In another embodiment, the processor 116 may be communicatively coupled to any of the various components or sub-systems of system 100 in any manner known in the art. Moreover, the processor 116 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 116 and other subsystems of the system 100 or systems external to system 100.

In some embodiments, various steps, functions, and/or operations of system 100 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link.

For instance, the various steps described throughout the present disclosure may be carried out by a single processor 116 or, alternatively, multiple processor 116. Moreover, different sub-systems of the system 100 may include one or more computing or logic systems. Therefore, the above description should not be interpreted as a limitation on the present disclosure but merely an illustration.

Figure 5:
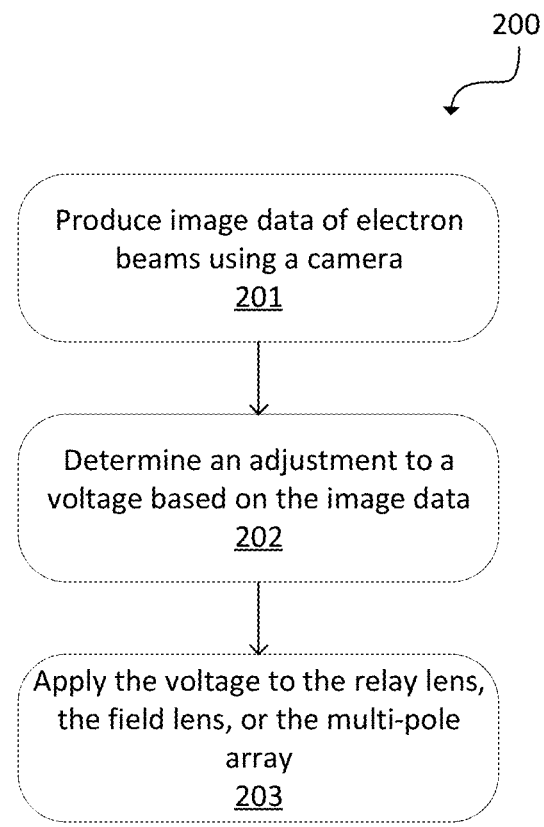
FIG. 5 is a flowchart of a method in accordance with the present disclosure.

FIG. 5 is a flowchart of a method 200. At 201, image data of a plurality of electron beams is produced using a camera. For example, photons produced from the electron beams can be projected at a fiber optics array having a plurality of targets and can be imaged using the camera. At 202, an image processing module is used to determine an adjustment to a voltage applied to a relay lens, a field lens, or a multi-pole array (e.g., an octupole) based on the image data. The adjustment minimizes at least one of a displacement, a defocus, or an aberration of one of the electron beams. Using a control module, the voltage is applied to the relay lens, the field lends, or the multi-pole array (e.g., the octupole) to perform the adjustment at 203.

In the method 200, the electron beams can be generated using an electron source. The electron beams can be projected through the relay lens, the field lens, the multi-pole array (e.g., the octupole), a projection lens, and/or into a scintillator.

Determining the adjustment can include measuring, using the image processing module, a displacement, a defocus, and/or an aberration of each of the electron beams with respect to a corresponding one of the targets. The adjustment can be determined to minimize the displacement, defocus, and/or aberration using the image processing module.

The method can include solving a sensitivity matrix Aij Vj=−Xi using the image processing module. Vj are voltages of the octupole and Xi are measured displacements of the electron beams. Using the control module, an inverse of the sensitivity matrix Aij can be applied to the multi-pole array (e.g., the octupole). Each element of the sensitivity matrix is defined as a ratio between dXi displacement and dVj.

In an example, there are 331 electron beams and 662 x and y offsets. These are used to make the Aij matrix.

The system 100 of FIG. 1 can be calibrated. In an instance, an image is taken using the camera 115. A voltage is applied to one of the multi-pole array (e.g., the octupole 108) and displacement of the electron beams 102 can be measured. This process can be repeated for each of the eight octupoles 108. The voltage is correlated to shift the electron beams 102.

A sensitivity or design matrix may be defined to correct beam centering errors on the fiber optic bundle. A goal of octupole calibration can be to measure this matrix. The matrix is built by compiling its rows with measured x and y displacement in response to an octupole single excitation. A single excitation is any combination of poles defined by a single voltage.

Figure 6:
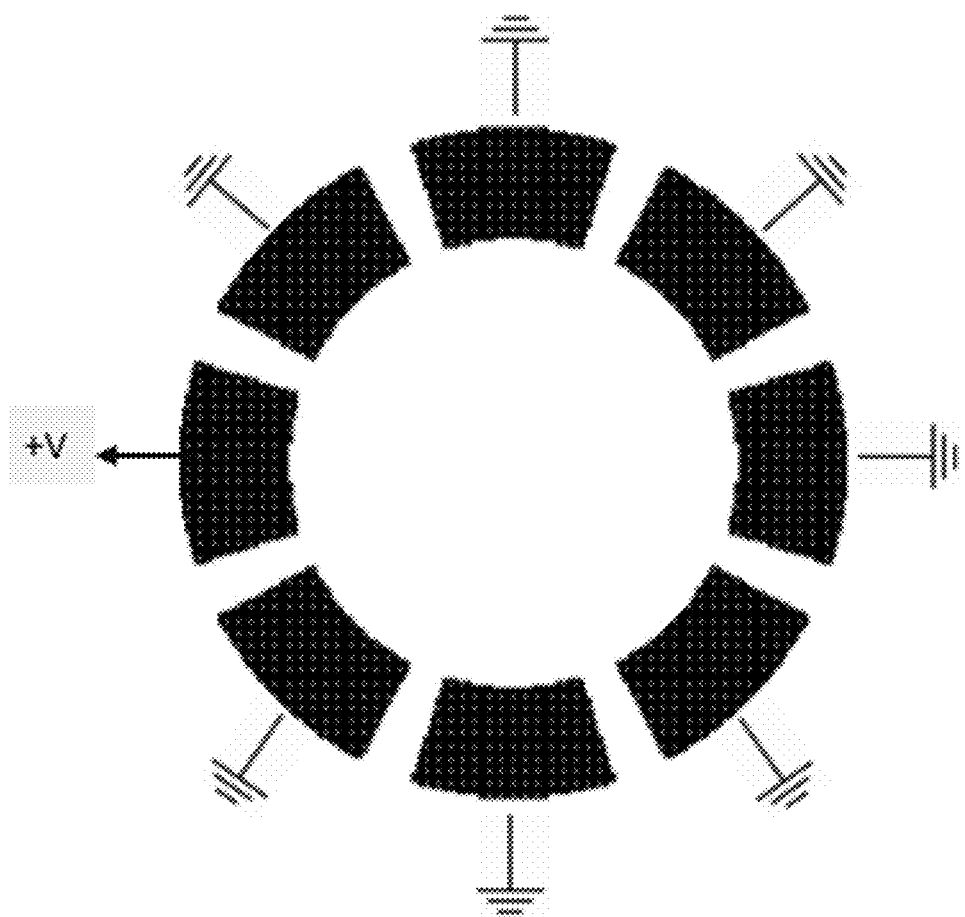
FIG. 6 illustrates single monopole excitation in an octupole, wherein there are eight possible single monopole excitations.
Figure 7:
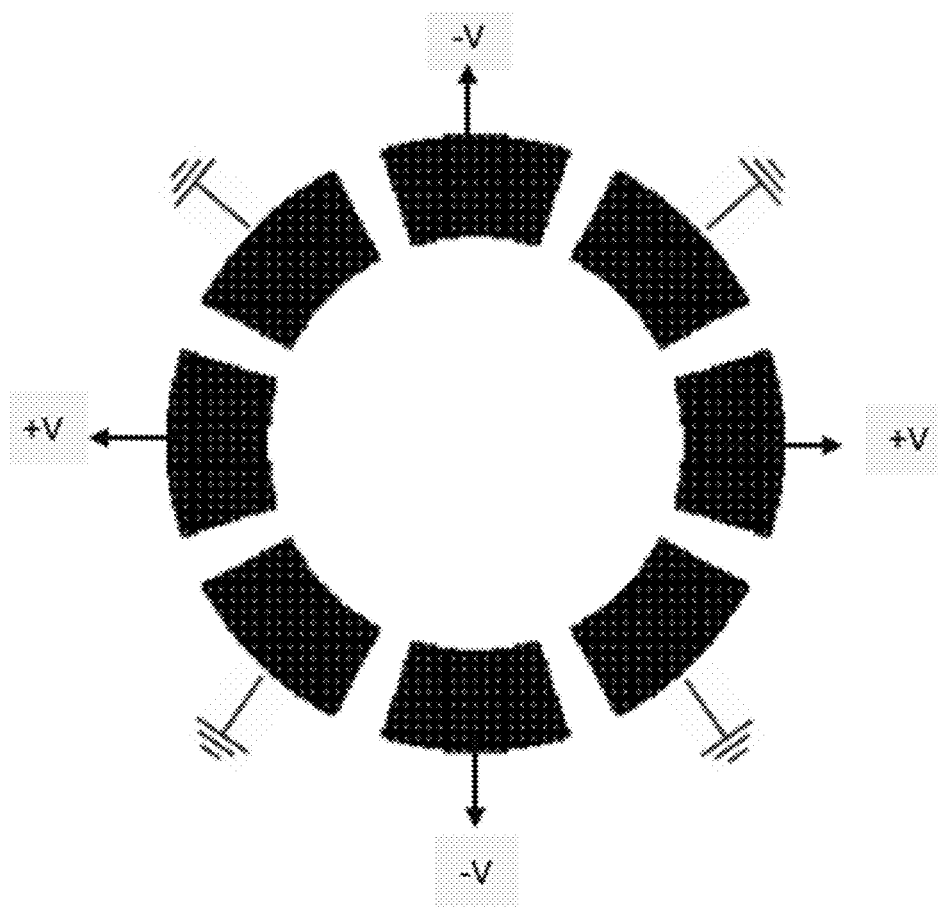
FIG. 7 illustrates a single quadrupole excitation in an octupole, wherein there are four possible single quadrupole excitations.
Figure 8:
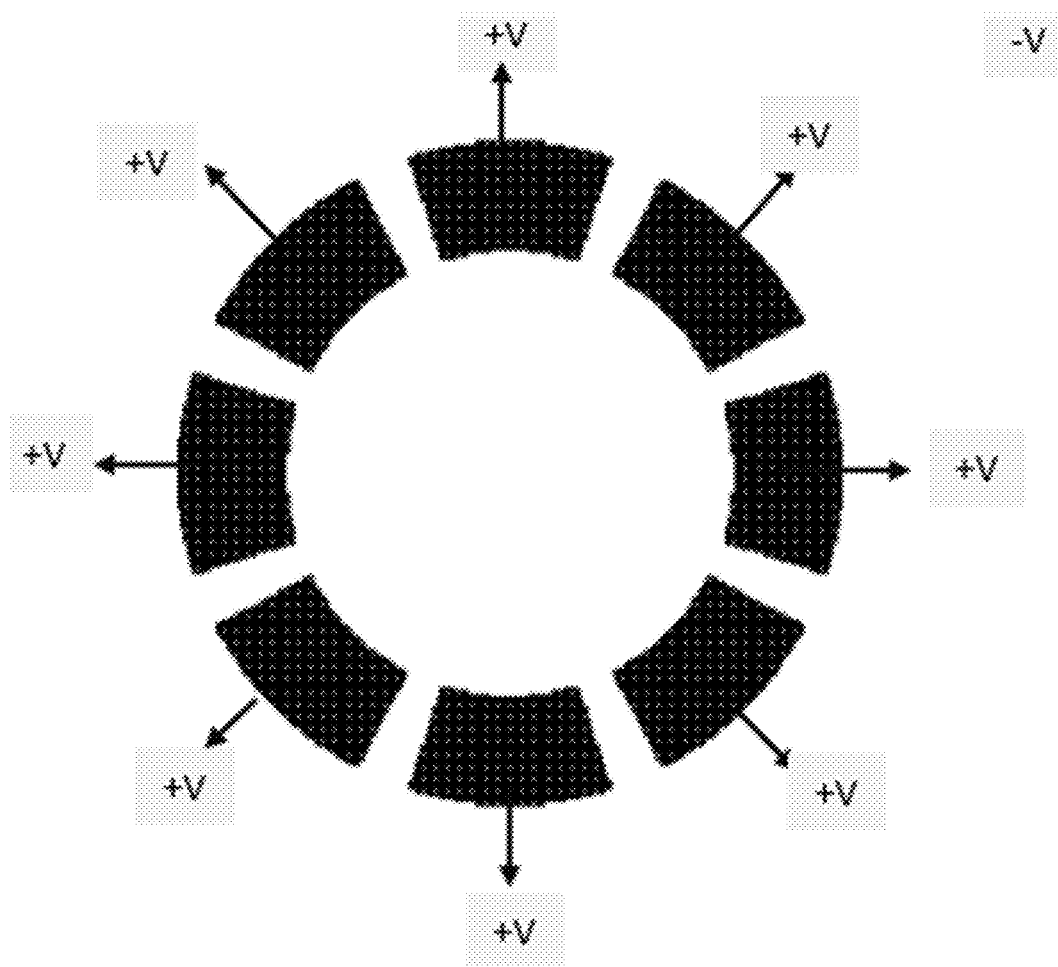
FIG. 8 illustrates a single Einzel excitation in an octupole, wherein there is only a single possible Einzel excitation.

FIGS. 6-8 illustrate possible excitations in the octupole, such as the octupole 108. FIG. 6 shows a single monopole excitation. There are eight different possible single monopole excitations with one pole energized and all the other grounded. FIG. 7 shows a single quadrupole excitation. There are four different possible quadrupole excitations. FIG. 8 shows a single Einzel excitation where all the poles are at the same voltage. There is an infinite number of single possible excitations identifiable by a single voltage V because any combination of electrodes can be formed and called a single excitation if it is identified by a voltage. In the octupole 108, the total number of single excitations considered is thirteen. This includes eight single monopole excitations, four quadrupole excitations, and one Einzel excitation. The excitations, or more in general predictor variables, are the columns of the design matrix. In an instance, there are 331 beams or 662 displacements (x and y), which means the design matrix is 662×13. The convention is applied such that the even rows are x and the odd rows are y.

Calibration can be performed by imaging a chemically mechanically polished conductive sample and by activating separately each of the considered excitations. For each single excitation, an image processing algorithm will measure the 662 displacements, producing one column of the design matrix. By performing this operation for all the thirteen excitations considered, the design matrix may be completely measured.

An additional embodiment relates to a non-transitory computer-readable medium storing program instructions executable on a processor. In particular, a processor, such as the processor 116, can be coupled to a memory in an electronic data storage medium with non-transitory computer-readable medium, such as the electronic data storage unit 119, that includes executable program instructions. The computer-implemented method may include any step(s) of any method(s) described herein. For example, processor 116 may be programmed to perform some or all of the steps of an embodiment of the method 200. The memory in the electronic data storage unit 119 may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

In an embodiment, one or more programs are included on a non-transitory computer-readable storage medium, such as the electronic data storage unit 119. The one or more programs are for executing steps on one or more computing devices. For example, the programs can execute steps that receive, at an image processing module, image data of a plurality of electron beams from a camera as the electron beams are projected at a fiber optics array having a plurality of targets. Using the image processing module, an adjustment to a voltage applied to a relay lens, a field lens, or an multi-pole array (e.g., the octupole) can be determined based on the image data. The adjustment minimizes at least one of a displacement, a defocus, or an aberration of one of the electron beams. Using a control module, the voltage is applied to the relay lens, the field lens, or the multi-pole array (e.g., the octupole) to perform the adjustment.

Determining the adjustment can include solving a sensitivity matrix Aij Vj=−Xi using the image processing module. Vj are voltages of the octupole and Xi are measured displacements of the electron beams. Using the control module, an inverse of the sensitivity matrix Aij can be applied to the multi-pole array (e.g., the octupole). Each element of the sensitivity matrix can be defined as a ratio between dXi displacement and dVj.

Determining the adjustment can include measuring, using the image processing module, a displacement, defocus, or aberration of each of the electron beams with respect to a corresponding one of the targets. The adjustment can be determined to minimize the displacement, defocus, or aberration using the image processing module.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:
1. A system comprising:
an electron source that generates electrons that form a plurality of electron beams;
a relay lens, wherein the electron source directs the electron beams to the relay lens;

a field lens disposed downstream of the relay lens along the path of the electron beams;

a multi-pole array disposed downstream of the field lens along the path of the electron beams, wherein the multi-pole array has at least four poles, and wherein the at least four poles of the multi-pole array are excited by a single pole excitation or a linear combination of excitations;

a projection lens disposed downstream of the multi-pole array along the path of the electron beams;

a scintillator disposed downstream of the projection lens along a path of the electron beams,
wherein the scintillator converts each of the electron beams into light;

a fiber optics array having a plurality of targets, wherein the fiber optics array is disposed to receive the light from each of the electrons beams using one of the targets;

a camera configured to image the light passing from the scintillator to the fiber optics array,
wherein the camera is configured to produce image data; and a processor in electronic communication with the camera, the relay lens, the field lens, and
the multi-pole array, wherein the processor is configured to:
determine an adjustment to a voltage applied to the relay lens, the field lens, or the multi-pole array based on image data from the camera; and
apply the adjustment to the relay lens, the field lens, or the multi-pole array.

2. The system of claim 1, further comprising a beam splitter disposed between the scintillator and the fiber optics array, wherein the beam splitter directs the light at the camera and the fiber optics array.

3. The system of claim 1, wherein the camera is a CMOS camera.

4. The system of claim 1, wherein the fiber optics array is hexagonal.

5. The system of claim 1, wherein the multi-pole array is an octupole.

6. The system of claim 1, wherein the processor is further configured to:
measure a displacement of each of the electron beams with respect to a corresponding one of the targets; and
determine the adjustment to minimize the displacement.

7. The system of claim 1, wherein the processor is further configured to:
measure a defocus of each of the electron beams with respect to a corresponding one of the targets; and
determine the adjustment to minimize the defocus.

8. The system of claim 1, wherein the processor is further configured to:
measure an aberration of each of the electron beams with respect to a corresponding one of the targets; and
determine the adjustment to minimize the aberration.

9. The system of claim 1, wherein the processor is further configured to solve the sensitivity matrix $A_{ij} V_j = -X_i$, wherein $V_j$ are voltages of the multi-pole array and wherein $X_i$ are measured displacements of the electron beams.

10. The system of claim 9, wherein an inverse of the sensitivity matrix $A_{ij}$ is applied to the multi-pole array, wherein each element of the sensitivity matrix is defined as a ratio between $dX_i$ displacement and $dV_j$.

11. A method comprising:
converting a plurality of electron beams into light using a scintillator;
producing image data of the light from the plurality of electron beams using a camera as the light from the electron beams is projected at a fiber optics array having a plurality of targets;
determining, using an image processing module, an adjustment to a voltage applied to a relay lens, a field lens, or a multi-pole array based on the image data, wherein the adjustment minimizes at least one of a displacement, a defocus, or an aberration of one of the electron beams, and wherein the multi-pole array has at least four poles that are excited by a single pole excitation or a linear combination of excitations; and
applying, using a control module, the voltage to the relay lens, the field lens, or the multi-pole array to perform the adjustment.

12. The method of claim 11, further comprising:
generating the electron beams using an electron source; and
projecting the electron beams through the relay lens, the field lens, the multi-pole array, a projection lens, and into the scintillator.

13. The method of claim 11, wherein the determining includes:
measuring, using the image processing module, the displacement of each of the electron beams with respect to a corresponding one of the targets; and
determining the adjustment to minimize the displacement using the image processing module.

14. The method of claim 11, wherein the determining includes:
measuring, using the image processing module, the defocus of each of the electron beams with respect to a corresponding one of the targets; and
determining the adjustment to minimize the defocus using the image processing module.

15. The method of claim 11, wherein the determining includes:
measuring, using the image processing module, the aberration of each of the electron beams with respect to a corresponding one of the targets; and
determining the adjustment to minimize the aberration using the image processing module.

16. The method of claim 11, wherein the determining includes solving a sensitivity matrix $A_{ij} V_j = -X_i$ using the image processing module, wherein $V_j$ are voltages of the multi-pole array and wherein $X_i$ are measured displacements of the electron beams, and wherein the method further comprises applying, using the control module, an inverse of the sensitivity matrix $A_{ij}$ to the multi-pole array, wherein each element of the sensitivity matrix is defined as a ratio between $dX_i$ displacement and $dV_j$.

17. The method of claim 11, wherein the multi-pole array is an octupole.

18. The method of claim 11, further comprising:
activating a combination of different excitations of the poles in the multi-pole array;
measuring a displacement of the electron beams for each of the different excitations; and
calibrating the multi-pole array based on a matrix of the displacement of the electron beams for each of the different excitations.

19. A non-transitory computer-readable storage medium, comprising one or more programs for executing the following steps on one or more computing devices:
receiving, at an image processing module, image data of a plurality of electron beams from a camera as light converted from the electron beams using a scintillator is projected at a fiber optics array having a plurality of targets;

determining, using the image processing module, an adjustment to a voltage applied to a relay lens, a field lens, or a multi-pole array based on the image data, wherein the adjustment minimizes at least one of a displacement, a defocus, or an aberration of one of the electron beams, and wherein the multi-pole array has at least four poles that are excited by a single pole excitation or a linear combination of excitations; and applying, using a control module, the voltage to the relay lens, the field lens, or the multi-pole array to perform the adjustment.

20. The non-transitory computer-readable storage medium of claim 19, wherein the determining includes solving a sensitivity matrix $A_{ij} V_j = -X_i$ using the image processing module, wherein $V_j$ are voltages of the multi-pole array and wherein $X_i$ are measured displacements of the electron beams, and further comprising applying, using the control module, an inverse of the sensitivity matrix $A_{ij}$ to the multi-pole array, wherein each element of the sensitivity matrix is defined as a ratio between $dX_i$ displacement and $dV_j$.

* * * * *